US008607028B2

(12) United States Patent
Kale et al.

(10) Patent No.: US 8,607,028 B2
(45) Date of Patent: Dec. 10, 2013

(54) ENHANCED ADDRESSABILITY FOR SERIAL NON-VOLATILE MEMORY

(75) Inventors: Poorna Kale, Folsom, CA (US); Chris Bueb, Folsom, CA (US); Tommaso Zerilli, Catania (IT); Raffaele Bufano, Catania (IT); Sandra Lospalluti, Catania (IT); Marco Gibilaro, Catania (IT)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 13/143,072

(22) PCT Filed: Dec. 30, 2008

(86) PCT No.: PCT/IB2008/055584
§ 371 (c)(1),
(2), (4) Date: Sep. 26, 2011

(87) PCT Pub. No.: WO2010/076600
PCT Pub. Date: Jul. 8, 2010

(65) Prior Publication Data
US 2012/0011304 A1  Jan. 12, 2012

(51) Int. Cl.
*G06F 12/00* (2006.01)
(52) U.S. Cl.
USPC ............................ 711/220; 711/103; 711/209
(58) Field of Classification Search
None
See application file for complete search history.

(56) References Cited

U.S. PATENT DOCUMENTS

| | | | |
|---|---|---|---|
| 4,037,211 A | 7/1977 | Ikuta et al. | |
| 5,338,981 A | 8/1994 | Kim et al. | |
| 5,598,575 A * | 1/1997 | Dent et al. | ...................... 710/28 |
| 6,078,526 A * | 6/2000 | Mitani | ..................... 365/185.33 |
| 2005/0044341 A1 | 2/2005 | Soroushi | |
| 2006/0056261 A1 | 3/2006 | Zink et al. | |
| 2007/0076479 A1* | 4/2007 | Kim et al. | ................. 365/185.11 |
| 2007/0192530 A1* | 8/2007 | Pedersen et al. | .............. 711/103 |
| 2008/0049505 A1 | 2/2008 | Kim et al. | |

FOREIGN PATENT DOCUMENTS

| | | |
|---|---|---|
| JP | 2000-3305 | 1/2000 |
| JP | 2001-517834 | 10/2001 |
| JP | 2004-102490 | 4/2004 |

OTHER PUBLICATIONS

European Search Report dated Sep. 11, 2012 in corresponding European Application No. 08879280.
International Search Report dated Jun. 29, 2009 in corresponding International Patent Application No. PCT/IB2008/055584.
Written Opinion dated Jun. 29, 2009 in corresponding International Patent Application No. PCT/IB2008/055584.
English Translation of Notice of Rejection Ground mailed on Apr. 30, 2013 for Japanese Patent No. 2011-542905.
English Translation of First Office Action issued on Sep. 3, 2013 for Chinese Patent No. 200880132558.8.

* cited by examiner

*Primary Examiner* — Shawn X Gu
(74) *Attorney, Agent, or Firm* — Knobbe, Martens, Olson & Bear LLP (57) ABSTRACT

A method and a memory device are provided for accessing a storage location. The method includes storing an extended address value in a register in a non-volatile memory device. The method further includes subsequently receiving multiple addresses and combining the stored extended address value with each of the multiple received addresses to produce multiple combined addresses. The method further includes accessing multiple storage locations within the non-volatile memory device based, at least in part, on the multiple combined addresses.

21 Claims, 5 Drawing Sheets

ENHANCED ADDRESSABILITY FOR SERIAL NON-VOLATILE MEMORY

RELATED APPLICATIONS

This application is a National Stage application of and claims the benefit of priority to PCT/IB2008/055584, filed Dec. 30, 2008, entitled Enhanced Addressability for Serial Non-Volatile Memory.

BACKGROUND

Subject matter disclosed herein may relate to non-volatile memory devices, and may relate more particularly to enhancing addressability for serial flash memory devices.

Non-volatile memory devices, including flash memory devices, may be found in a wide range of electronic devices. In particular, flash memory devices may be used in computers, digital cameras, cellular telephones, personal digital assistants, etc. For many applications, flash memory devices may store instructions to be executed on a processor, and in at least some of these applications, the processor may fetch instructions from the flash memory devices, such as, for example, in execute-in-place (XiP) implementations. For these applications and others, the range of flash memory addresses, and therefore flash memory storage capacity, that is accessible to the processor or other system component may impact the range of possible applications that may benefit from flash memory.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

Some portions of the detailed description which follow are presented in terms of algorithms or symbolic representations of operations on data bits or binary digital signals stored within a computing platform memory, such as a computer memory. These algorithmic descriptions or representations are examples of techniques used by those of ordinary skill in the data processing arts to convey the substance of their work to others skilled in the art. An algorithm here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining"

or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform. Further, unless specifically stated otherwise, processes described herein, with reference to flow diagrams or otherwise, may also be executed and/or controlled, in whole or in part, by such a computing platform.

As discussed above, for many applications, flash memory devices may store instructions to be executed on a processor, and in at least some of these applications, the processor may fetch instructions from the flash memory devices, such as, for example, in execute-in-place (XiP) implementations. As used herein, the term "execute-in-place", along with its abbreviation "XiP", relates to a processor fetching instructions from a long term storage device, such as, for example, a flash memory, rather than fetching instructions from an intermediate storage, such as, for example, a dynamic random access memory (DRAM).

Flash memory may be characterized at least in part by the ability to be electrically erasable and programmable, and may be utilized in a very wide range of electronic device types, including, but not limited to, digital cameras, cellular telephones, personal digital assistants, portable navigation devices, portable music players, notebook computers, desktop computers, etc., to name but a few examples. Also, flash memory devices may comprise either parallel data interfaces or serial interfaces. Parallel interfaces, in at least some instances, may allow for relatively good data throughput due at least in part to increased numbers of input/output terminals. Serial interfaces, on the other hand, may provide reduced costs due at least in part to reduced numbers of input/output terminals. Serial flash memory devices may typically be addressed with a 24 bit address, for a total of 16M storage locations. For byte-wide devices, the total storage capacity may comprise a maximum of 128 Mb. For XiP applications and others, the relatively restricted range of addresses and storage capacity for typical serial flash memory devices may impact the range of applications that may benefit from serial flash memory technology.

As system designers seek to provide increased performance while reducing costs, it may be advantageous to enhance the addressability of serial flash memory devices. It may also be advantageous to enhance addressability without modifying the standard serial peripheral interconnect (SPI) protocol, which calls for an 8-bit instruction code and a 24-bit address. Such a change in protocol would require chip manufacturers, for example, to modify their devices to accommodate greater than 24-bit addresses. Embodiments described herein may enhance addressability, and therefore maximum storage capacity, of serial flash memory devices, without requiring changes to the SPI protocol. Further, although embodiments described herein may refer to serial flash memory devices, the scope of claimed subject matter is not so limited. Other embodiments may utilize other types of nonvolatile memory, including, but not limited to, read-only memory (ROM), phase-change memory (PCM), etc., to name but a couple of examples.

Figure 1:
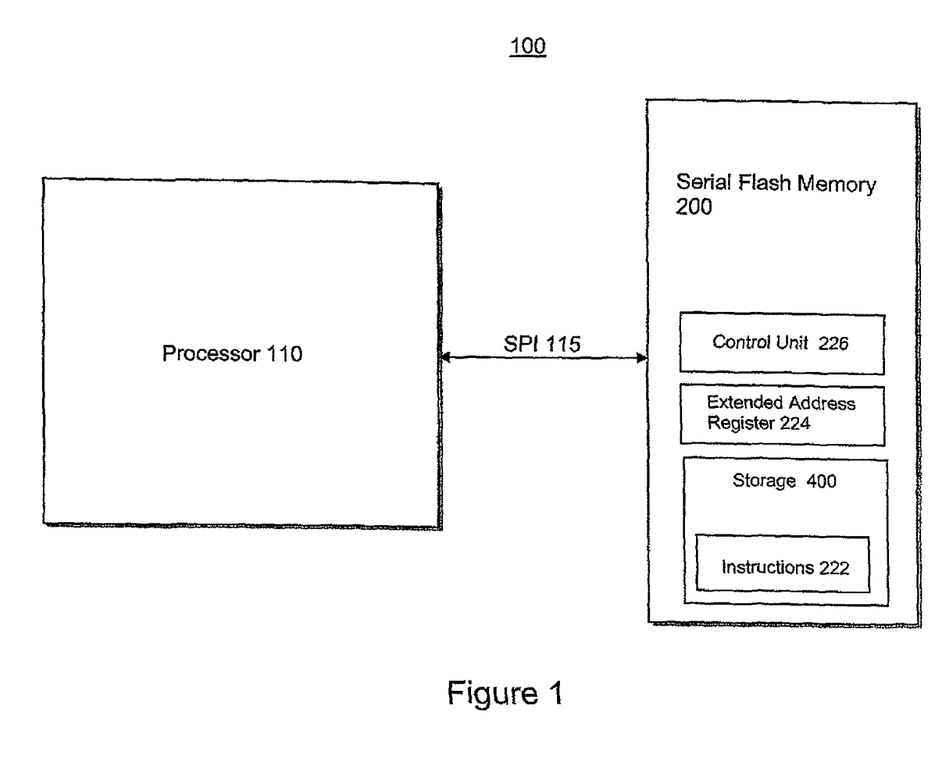
FIG. 1 is a block diagram of an example embodiment of a computing platform including a serial flash memory device.

FIG. 1 is a block diagram of an example embodiment of a computing platform 100, comprising a processor 110 and a serial flash memory 200. Memory 200 for this example is coupled to processor 110 by way of a serial peripheral interface (SPI) 115, as discussed more fully below. For one or more embodiments, Serial Flash Memory 200 may comprise a control unit 226 and an extended address register 224.

Memory 200 may also comprise a storage area 400 comprising a plurality of storage locations. Further, memory 200 may store instructions 222 that may comprise code for any of a wide range of possible operating systems and/or applications. The instructions may be executed by processor 110. Note that for this example, processor 110 and memory 200 are configured as an execute-in-place (XiP) type implementation, where processor 110 may fetch instructions directly from a long-term storage device.

For one or more embodiments, control unit 226 may receive one or more signals from processor 110 and may generate one or more internal control signals to perform any of a number of operations, including data read operations, by which processor 110 may access instructions 222, for example. As used herein, the term "control unit" is meant to include any circuitry or logic involved in the management or execution of command sequences as they relate to flash memory devices.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

Figure 2:
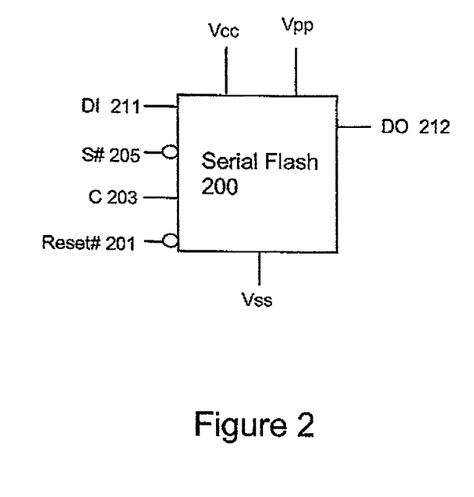
FIG. 2 is a block diagram depicting an example embodiment of a serial flash memory device configured for single input and single output operation.

As mentioned above, for an embodiment, processor 110 may be coupled to serial flash memory 200 by way of a serial peripheral interface 115. The term "serial peripheral interface" for an embodiment refers to a de facto standard for serial communications between components in some electronic devices. SPI 115 may comprise a number of signals, as will be discussed more fully below, including a clock signal, input/output signals, and a slave select signal. FIG. 2, as discussed below, depicts one example mode of operation for SPI 115 as it relates to serial flash memory device 200. For the example of FIG. 2, a single input/single output mode of operation is depicted. However, this is merely an example mode of operation, and the scope of claimed subject matter is not limited in this respect. Other possible modes of operation may include, but are not limited to, dual input/output interface operations, and quad input/output interface operations.

For one or more embodiments, storage 400 may be organized into a plurality of subsets of storage locations. Individual subsets may be identified, for an example embodiment, by an extended address value stored in the extended address register 224. Storage locations with the identified subset may be identified by an address received, for this example, from processor 110. As discussed more fully below, an address compatible with SPI may comprise 24 bits. Ordinarily, the 24 bit address would be able to identify a maximum of 16M storage locations. However, if used in conjunction with the extended address register 224, greater than 16M storage locations may be addressed. For an embodiment using an 8-bit extended address register and assuming byte-wide storage locations, the maximum addressable memory space may reach 32 Gb. The increase in addressable memory space while maintaining the 24 bit addresses of the SPI protocol may enable system designers to utilize serial flash memory devices in applications where larger memory spaces are desired. Of course, the memory organizations described herein are merely examples, and the scope of claimed subject matter is not limited in these respects. Also, the SPI protocol is merely an example protocol, and again, the scope of claimed subject matter is not so limited.

FIG. 2 is a block diagram depicting an example embodiment of a serial flash memory device configured for single input/output (I/O) interface operations. Serial flash memory 200 may comprise a terminal Vcc to be coupled to a power source, and a terminal Vpp that may also be coupled to a power source, but which may also have other purposes in other configurations, as discussed below. Memory 200 may also include a terminal Vss that may provide an electrical connection to a ground signal. Serial flash memory 200 for this example may also comprise a data input terminal DI 211 and a data output terminal DO 212, as well as a Reset# signal terminal 201, a clock C signal terminal 203, and a Slave (S#) signal 205. If serial flash memory 200 is operating in the single input, single output mode, information may be shifted into the memory via DI 211, and may be shifted out of the memory via DO 212. For one or more embodiments, terminal 201 may be used for other purposes, including, but not limited to, a HOLD# signal, for example. Of course, the scope of claimed subject matter is not limited in this respect.

Figure 3:
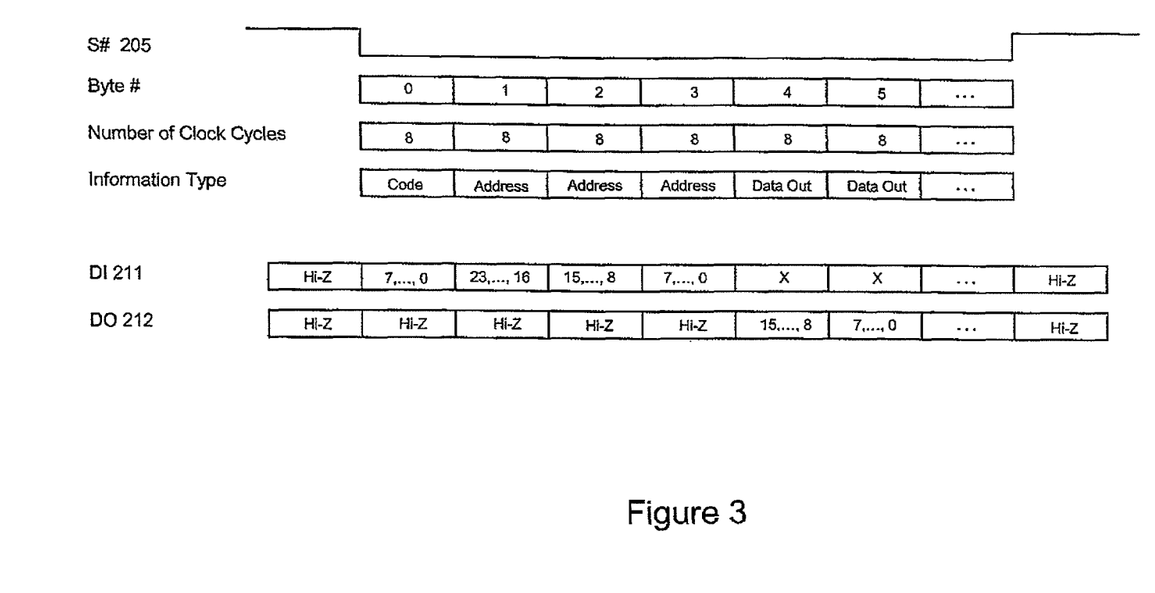
FIG. 3 is a diagram of an example serial peripheral interface read operation.

FIG. 3 depicts an example command sequence compatible with the SPI protocol for one or more embodiments. For an embodiment, an SPI command sequence may begin with a one byte command code that may be initiated with a falling edge of S#205. The 8 bit command code may be latched into DI 211, most significant bit (MSB) first, for an example embodiment, on a rising edge of C 203. Depending on the particular command code, the command code may be followed by additional address bytes, followed by dummy bytes and/or data bytes. The total number of input cycles for a command depends on the particular command code. Further, for this example, address bits may be latched at DI 211 on the rising edge of C. Also, cycles during which undefined (don't care) data are shifted onto DI 211 may be referred to as dummy clock cycles. Also, for an embodiment, as with the command code, the address, dummy, and data bytes are latched at DI 211 most significant bit first, for this example, although the scope of claimed subject matter is not limited in this respect. For the example of FIG. 3, the command sequence is a read operation, and there are no dummy cycles. The command code is received at byte 0, comprising eight clock cycles, and three address bytes are received during the subsequent 24 clock cycles.

Further, for an embodiment, depending upon the particular command code, data bytes may either be latched as input data at DI 211 or transmitted as output data from DO 212. For cycles that input data through DI 211, DO 212 may be set to a high impedance (Z) state. Because for this example the instruction code indicates a read cycle, data is shifted out onto DO 212 during bytes 4 and 5.

Also for an embodiment, a rising edge of S#205 may signal an end to the command sequence and may initiate a resetting of the SPI interface. A de-assertion of S# may also result in a termination of the output data stream for read operations, may bring DO 212 to a high Z state, and may also result in memory 200 entering a standby mode. Of course, these are merely examples of the possible results of a de-assertion of S#205, and the scope of claimed subject matter is not limited in these respects. It should be noted that the operations, command sequences, and serial flash memory device configurations described herein are merely examples, and the scope of claimed subject matter is not limited in this respect.

As can be seen in FIG. 3, for SPI read and write operations, a 24-bit address is used. The 24 bit address provides for identifying 16M storage locations within a memory. However, by utilizing extended address register 224, any of a number of subsets, or segments, of memory locations may be identified, and the 24-bit address can be used to identify particular storage locations within an identified segment. For an example embodiment, the individual segments may comprise up to 16M storage locations, and with multiple segments, a number of storage locations greater than 16M may be achieved.

Figure 4:
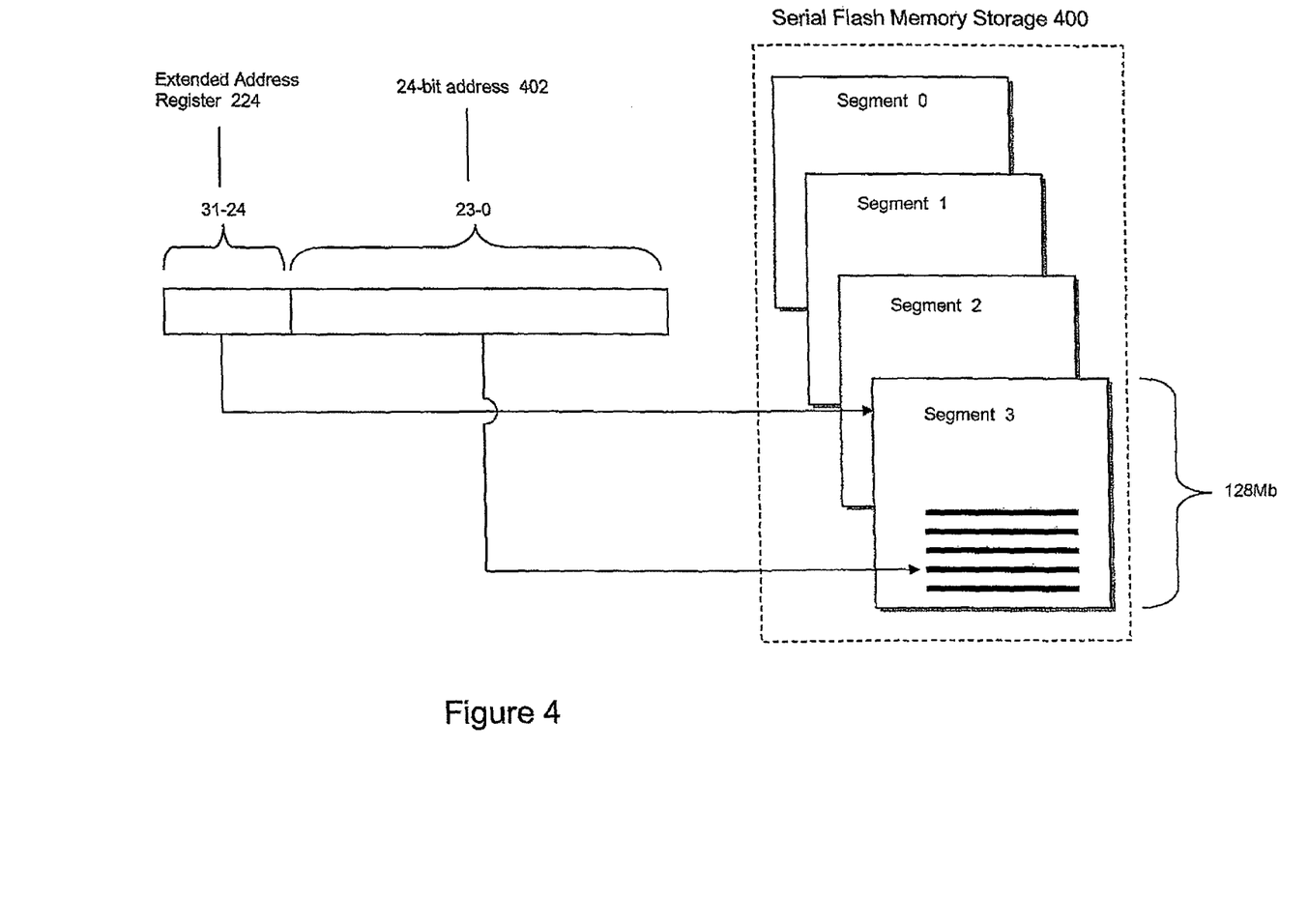
FIG. 4 is a block diagram of an example embodiment of a serial flash memory storage unit.

FIG. 4 depicts a block diagram of an example embodiment of serial flash memory storage unit 400, initially illustrated in FIG. 1. For an embodiment, storage 400 may comprise a number of segments. For the example of FIG. 4, four segments are depicted. However, this is merely an example organization of storage 400, and the scope of claimed subject matter is not limited in this respect. For example, other embodiments may incorporate fewer than four segments, and still other embodiments may incorporate more than four segments. For one or more embodiments, the individual segments may include as many storage locations as can be identified by an address, exclusive of any extended address value. For example, for a 24-bit address scheme, the individual segments may comprise 16M storage locations. For embodiments incorporating a byte-wide memory organization, the individual segments may comprise 128 Mb of storage. Therefore, for the four segments, the total memory storage capacity of storage 400 comprises 512 Mb. However, this is merely an example storage capacity, and the scope of claimed subject matter is not limited in this respect.

For the example embodiment depicted in FIG. 4, extended address register 224 may comprise 8 bits. Processor 110 for this example may write an extended address value to memory 200, and the value may be stored in extended address register 224. The 8-bit value stored in register 224 may be combined with 24-bit address 402, subsequently received from the processor, to produce a 32-bit address that may be utilized to access a storage location. For an embodiment, the value stored in extended address register 224 may comprise the most significant byte in the example 32-bit address, and may identify one of the segments. For example, a value of 00000011b in extended address register 224 may cause memory accesses to occur to and/or from segment 3. A value of 00000000b may identify segment 0, 00000001b may identify segment 1, and 00000010b may identify segment 2, for an example embodiment. The particular storage location within the selected segment that is to be accessed may be determined by 24-bit address 402. Also for an embodiment, if subsequent memory accesses are intended for segment 3, for the current example, no further write operations to extended address register 224 are required, and any received 24-bit addresses will designate storage locations with segment 3.

As described above, for one or more example embodiments, the first, second, and third address bytes for a memory access are utilized in a conventional fashion, in at least some cases in accordance with the SPI protocol. A fourth address byte may be provided by extended address register 224, for an embodiment, to allow memory access to addresses greater than what would be otherwise provided for in the SPI protocol. Extended address register 224 may be programmed by a dedicated write instruction, for one or more embodiments.

For an example embodiment, the code may be C5h, although the scope of claimed subject matter is not limited in this respect. For an embodiment, the default value for register 224 may be 00h, although again, the scope of claimed subject matter is not limited in this respect. Also for an embodiment, a dedicated read instruction may be used to verify the contents of extended address register 224. The instruction code for one example embodiment may be 66h, although once again, the scope of claimed subject matter is not so limited.

In the following discussion, several example memory organizations are discussed. However, the organizations and techniques discussed are merely examples, and the scope of claimed subject matter is not limited in these respects. For one example embodiment, a 256 Mb flash memory may be visualized as two 128 Mb banks. The example depicted in FIG. 4 shows four segments, but for this example, two banks are discussed. In the case of two segments or banks, the least significant bit of the extended address register controls which of the two segments are to be accessed. As used herein, the terms "bank," "segment," and "subset" are used herein interchangeably. For this 256 Mb, two segment example, if the $0^{th}$ segment is to be accessed, a value of 00000000b may be written to 8-bit extended address register 224, and if segment 1 is to the accessed, a value of 00000001b may be written to register 224. In this manner, the least significant bit of register 224 may act as address bit [24] of a 25 bit address, providing access to 256 Mb of storage space.

For an example where a 512 Mb flash memory device is organized into four 128 Mb banks, such as depicted in FIG. 4, if segment 2 is to be accessed, a value of 00000010b may be written to extended address register 224. If segment 3 is to be accessed, a value of 00000011b may be stored in register 224. In this manner, the two least significant bits of register 224 may act as address bits [25, 24] of a 26 bit address, providing access to 512 Mb of storage space.

For another example, consider a case where a fast read operation is to be performed. The fast read operation may result in 128 Mb of data being shifted out of flash memory 200 on output terminal DO 212. If for this example it is assumed that extended address register 224 has stored therein a value of 00000000b, and if the fast read command code is received at flash memory 200 followed by a three byte address, 128 Mb of data may be shifted out onto DO 212 beginning with the data stored at the storage location identified by the three-byte address within the segment identified by extended address register 224, which, for this example, is segment 0. For one or more embodiments, if the chip remains selected, the full 128 Mb may be retrieved from storage 400, even if the 128 Mb spans from one segment to another. The address may be incremented internally within memory 200 so that if the 128 Mb crosses segment borders, the data may be retrieved in a contiguous block.

Similarly, consider an example where a fast read operation is to be performed with an address beginning at segment 1. For this example, assume that storage 400 comprises two 128 Mb segments, rather than the four segments depicted in FIG. 4. For this example, in order to begin the fast read of the 128 Mb from segment 1, a write operation may be performed to program extended address register 224 with the value 0000001b. After the extended address register write operation, the fast read operation may be initiated by sending the appropriate code command from processor 110 to memory 200 and subsequently sending the appropriate three-byte address. One dummy cycle later, data may begin to be shifted out onto DO 212 starting at the storage location identified by the three-byte address within segment 1, identified by extended address register 224. As with the previous example, if the chip select remains active, the address may be incremented internally within memory 200 such that the address may roll-over from the end of segment 1 to the beginning of segment 0 if the 128 Mb spans from segment 1 to segment 0.

For the examples described above, memory accesses are made to a serial flash memory device using conventional memory read and write operations and using conventional addresses. For some examples, the operations may be compatible with the SPI protocol. Addressability for the serial flash memory in the example embodiments is enhanced by an extended address register that may be used to specify particular segments of memory to be accessed. By writing appropriate values to the extended address register before performing memory read and/or write operations, those operations may be performed using conventional addressing schemes to access storage locations within the specified segment of memory. In this manner, memory spaces larger than what would ordinarily be possible using the conventional addressing may be achieved.

Figure 5:
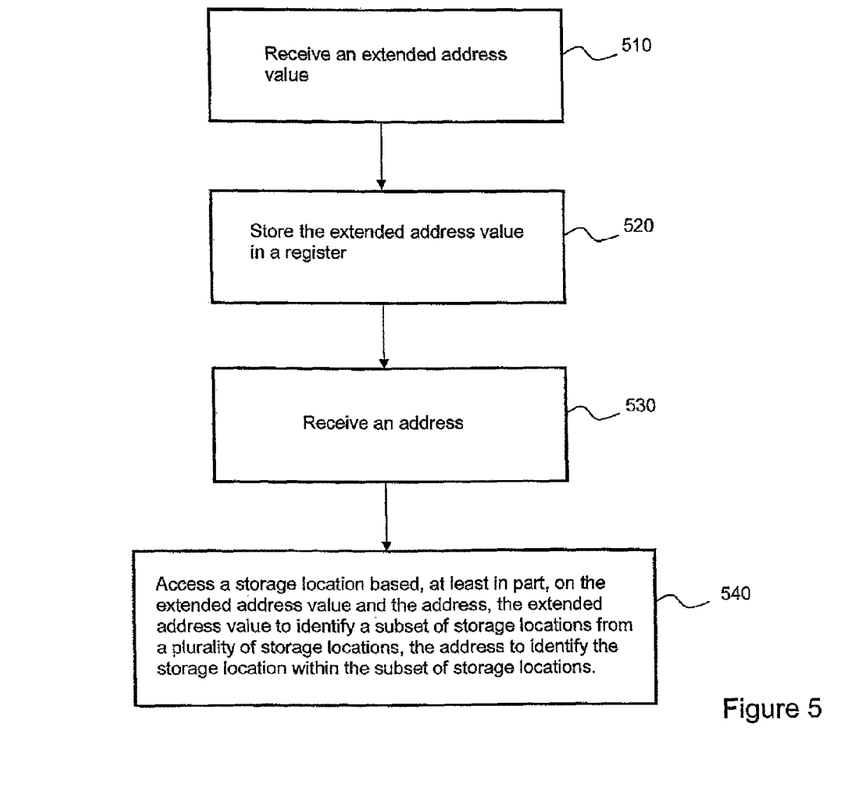
FIG. 5 is a flow diagram of an example embodiment of a method for enhancing addressability for a serial flash memory device.

FIG. 5 is a flow diagram of an example embodiment of a method for enhancing addressability for a serial flash memory device. At block 510, an extended address value may be received at a serial flash memory device. As described previously, the extended address value may identify one of a plurality of subsets of storage locations in the serial flash memory device. At block 520, the extended address value may be stored in an extended address register in the serial flash memory device. The extended address value may be utilized in conjunction with a conventional address, such as an address that is compatible with the SPI protocol, in order to access an amount of memory that would otherwise not be possible without the extended address value. The address to be used in conjunction with the extended address value may be received by the flash memory device, as depicted at block 530. At block 540, a storage location within the memory device may be accessed based, at least in part, on the extended address value and the received address. The extended address value may identify the subset of storage locations from among a number of subsets, and the received address may identify a particular storage location within the identified subset of storage locations. In this manner, a maximum addressable flash memory storage space may be accessed without being bound by the number of bits of the address. Of course, the above is merely an example of enhancing addressability of serial flash'memory devices, and the scope of claimed subject matter is not limited to these specific details. For example, embodiments in accordance with claimed subject matter may include all, less than, or more than, blocks 510-540. Also, the order of blocks 510-540 is merely and example order, and the scope of claimed subject matter is not limited in this respect.

Of course, the enhanced address register and storage unit configurations and organizations discussed above are merely examples, and a wide range of alternative embodiments are possible. The scope of claimed subject matter is not limited to the specific detail of the example embodiments described herein. For example, although embodiments described herein mention 24-bit addresses and 8-bit extended address registers, the scope of claimed subject matter is not limited in these respects, and other address sizes and extended address register and value sizes may be utilized, for one or more embodiments.

In the preceding description, various aspects of claimed subject matter have been described. For purposes of explanation, systems or configurations were set forth to provide an understanding of claimed subject matter. However, claimed subject matter may be practiced without those specific details.

In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method, comprising:
storing an extended address value in a register in a non-volatile memory device, the stored extended address value identifying a first subset of storage locations from a plurality of subsets of storage locations;
receiving a fast read command code and an address subsequently to said storing the extended address value in the register, the fast read command code corresponding to reading a contiguous block of data from the non-volatile memory device;
combining the stored extended address value with the address to produce a combined address; and
accessing the contiguous block of data within the non-volatile memory device based, at least in part, on the combined address by beginning the contiguous block at the combined address and spanning a border between the first subset of storage locations and a second subset of storage locations.

2. The method of claim 1, wherein said extended address value comprises an eight bit value identifying the first subset of storage locations.

3. The method of claim 1, wherein said address comprises a twenty-four bit address identifying a storage location within the identified first subset of storage locations.

4. The method of claim 3, wherein said non-volatile memory device comprises a serial flash memory device and wherein said address of comprises an address compatible with a serial peripheral interface protocol.

5. The method of claim 1, further comprising receiving the extended address value via a write operation compatible with a serial peripheral interface protocol.

6. The method of claim 1, wherein one or more of the plurality of subsets comprises 16M storage locations.

7. The method of claim 1, wherein one or more storage locations of the contiguous block comprises an 8-bit storage location.

8. A serial non-volatile memory device, comprising:
a plurality of storage locations organized into a plurality of subsets;
an extended address register to store an extended address value, the extended address value identifying a first subset of the plurality of subsets;
an input terminal to receive the extended address value and to receive a fast read command and an address subsequently to storing the extended address value, the fast read command corresponding to reading a contiguous block of data from the non-volatile memory device; and
a control unit to access the contiguous block of data beginning at a storage location identified, at least in part, by a combined address comprising of the extended address value stored in the extended address register and the address, the contiguous block spanning a border between the first subset of the plurality of subsets and a second subset of the plurality of subsets.

9. The memory device of claim 8, wherein the extended address value comprises an eight bit value.

10. The memory device of claim 9, wherein the address comprises a twenty-four bit address.

11. The memory device of claim 10, the control unit adapted to perform read and/or write operations compatible with a serial peripheral interface protocol, and wherein said non-volatile memory device comprises a serial flash memory device.

12. The memory device of claim 11, the control unit further adapted to perform a write operation compatible with the serial peripheral interface protocol to the extended address register at least in part in response to receiving the extended address value at the input terminal.

13. The memory device of claim 8, wherein one or more of the plurality of subsets comprises 16M storage locations.

14. The memory device of claim 13, wherein the plurality of storage locations comprise 8-bit storage locations, and wherein the plurality of subsets comprise subsets with a capacity of 128 Mb to provide a total capacity for the memory device of greater than 128 Mb.

15. A system, comprising:
a processor; and
a serial non-volatile memory device coupled to the processor, the memory device comprising:
a plurality of storage locations organized into a plurality of subsets;
an extended address register to store an extended address value, the extended address value identifying a first subset of the plurality of subsets;
an input terminal to receive the extended address value from the processor and to receive a fast read command and an address from the processor subsequently to storing the extended address value, the fast read command corresponding to reading a contiguous block of data from the non-volatile memory device;
and
a control unit to access the contiguous block of data beginning at a storage location identified, at least in part, by a combined address comprising the extended address value stored in the extended address register and the address, the contiguous block spanning a border between the first subset of the plurality of subsets and a second subset of the plurality of subsets received addresses to identify storage locations within the identified subset.

16. The system of claim 15, wherein the extended address value comprises an eight bit value.

17. The system of claim 16, wherein the address comprises a twenty-four bit address.

18. The system of claim 15, the control unit adapted to perform read and/or write operations compatible with a serial peripheral interface protocol, and wherein the serial non-volatile memory device comprises a serial flash memory device.

19. The system of claim 18, the control unit further adapted to perform a write operation compatible with the serial peripheral interface protocol to the extended address register at least in part in response to receiving the extended address value from the processor.

20. The system of claim 15, wherein one or more of the plurality of subsets comprises 16M storage locations.

21. The system of claim 20, wherein the plurality of storage locations comprise 8-bit storage locations, and wherein the plurality of subsets comprise subsets with a capacity of 128 Mb to provide a total capacity for the memory device of greater than 128 Mb.

* * * * *

UNITED STATES PATENT AND TRADEMARK OFFICE
CERTIFICATE OF CORRECTION

PATENT NO.        : 8,607,028 B2                                           Page 1 of 1
APPLICATION NO.   : 13/143072
DATED             : December 10, 2013
INVENTOR(S)       : Poorna Kale et al.

It is certified that error appears in the above-identified patent and that said Letters Patent is hereby corrected as shown below:

In the Claims

Column 9, line 36, in Claim 4, after "address" delete "of".

Column 9, line 60, in Claim 8, after "comprising" delete "of".

Column 10, lines 42-44, in Claim 15, delete "subsets received addresses to identify storage locations within the identified subset." and insert -- subsets. --, therefor.

Signed and Sealed this
Twenty-fifth Day of March, 2014

Michelle K. Lee
*Deputy Director of the United States Patent and Trademark Office*